United States Patent
McLellan et al.

(10) Patent No.: US 8,610,262 B1
(45) Date of Patent: Dec. 17, 2013

(54) BALL GRID ARRAY PACKAGE WITH IMPROVED THERMAL CHARACTERISTICS

(75) Inventors: Neil McLellan, Danville, CA (US); Ming Wang Sze, Kowloon (HK); Kwok Cheung Tsang, Kowloon (HK); Wing Keung Lam, Kowloon (HK); Wai Kit Tam, Kowloon (HK)

(73) Assignee: UTAC Hong Kong Limited, Tsuen Wan, N.T. (HK)

( * ) Notice: Subject to any disclaimer, the term of this patent is extended or adjusted under 35 U.S.C. 154(b) by 0 days.

(21) Appl. No.: 11/061,895

(22) Filed: Feb. 18, 2005

(51) Int. Cl.
*H01L 23/10* (2006.01)

(52) U.S. Cl.
USPC ............ 257/706; 257/712; 438/122; 438/125

(58) Field of Classification Search
USPC .......... 257/712, 713, 714, 717, E23.101, 706; 438/122, 125
See application file for complete search history.

(56) References Cited

U.S. PATENT DOCUMENTS

| | | |
|---|---|---|
| 4,698,662 A | 10/1987 | Young et al. |
| 5,172,213 A | 12/1992 | Zimmerman |
| 5,311,060 A | 5/1994 | Rostoker et al. |
| 5,329,423 A | 7/1994 | Scholz |
| 5,339,216 A | 8/1994 | Lin et al. |
| 5,435,732 A | 7/1995 | Angulas et al. |
| 5,444,025 A | 8/1995 | Sono et al. |
| 5,493,153 A | 2/1996 | Arikawa et al. |
| 5,610,442 A | 3/1997 | Schneider et al. |
| 5,639,694 A | 6/1997 | Diffenderfer et al. |
| 5,650,663 A | 7/1997 | Parthasarathi |
| 5,679,978 A | 10/1997 | Kawahara et al. |
| 5,705,851 A | 1/1998 | Mostafazadeh et al. |
| 5,736,785 A | 4/1998 | Chiang et al. |
| 5,773,362 A | 6/1998 | Tonti et al. |
| 5,877,552 A | 3/1999 | Chiang |
| 5,898,219 A | 4/1999 | Barrow |
| 5,901,043 A | 5/1999 | Lin et al. |
| 5,977,626 A | 11/1999 | Wang et al. |

(Continued)

FOREIGN PATENT DOCUMENTS

| | | |
|---|---|---|
| DE | 109 15 962 A | 10/2001 |
| JP | 2-278783 | 11/1990 |
| JP | 9-232690 | 9/1997 |

OTHER PUBLICATIONS

Printout of definition of the word "cap" from Academic Press Dictionary of Science and Technology, 1 page.*

(Continued)

*Primary Examiner* — Ajay K Arora
(74) *Attorney, Agent, or Firm* — Winstead PC

(57) ABSTRACT

An integrated circuit package includes a substrate having first and second surfaces and a plurality of conductive traces therebetween and a semiconductor die mounted on the first surface of the substrate. A plurality of wire bonds connect the semiconductor die to ones of the conductive traces of the substrate and an encapsulant encapsulates the wirebonds and the semiconductor die. A heat spreader has a cap, at least a portion of the cap extending inwardly toward and being spaced from the semiconductor die. The encapsulant fills the space between the portion of the cap and the semiconductor die. The heat spreader further has at least one sidewall extending from the cap, the at least one sidewall disposed on the substrate. A ball grid array is disposed on the second surface of the substrate, bumps of the ball grid array being in electrical connection with ones of the conductive traces.

11 Claims, 6 Drawing Sheets

(56) References Cited

U.S. PATENT DOCUMENTS

| | | | |
|---|---|---|---|
| 5,985,695 | A | 11/1999 | Freyman et al. |
| 5,986,885 | A | 11/1999 | Wyland |
| 6,011,304 | A * | 1/2000 | Mertol .................. 257/706 |
| 6,016,013 | A | 1/2000 | Baba |
| 6,037,658 | A | 3/2000 | Brodsky et al. |
| 6,049,125 | A * | 4/2000 | Brooks et al. .................. 257/712 |
| 6,075,712 | A | 6/2000 | McMahon |
| 6,175,161 | B1 | 1/2001 | Goetz et al. |
| 6,181,569 | B1 | 1/2001 | Chakravorty |
| 6,236,568 | B1 | 5/2001 | Lai et al. |
| 6,251,706 | B1 | 6/2001 | Paniccia |
| 6,300,679 | B1 * | 10/2001 | Mukerji et al. .............. 257/738 |
| 6,323,066 | B2 | 11/2001 | Lai et al. |
| 6,388,335 | B1 | 5/2002 | Lam |
| 6,414,385 | B1 | 7/2002 | Huang et al. |
| 6,462,405 | B1 | 10/2002 | Lai et al. |
| 6,525,421 | B1 | 2/2003 | Chia et al. |
| 6,552,428 | B1 * | 4/2003 | Huang et al. .................. 257/706 |
| 6,631,078 | B2 | 10/2003 | Alcoe et al. |
| 6,656,770 | B2 | 12/2003 | Atwood et al. |
| 6,737,755 | B1 | 5/2004 | McLellan et al. |
| 6,800,948 | B1 | 10/2004 | Fan et al. |
| 6,818,472 | B1 | 11/2004 | Fan et al. |
| 6,967,126 | B2 * | 11/2005 | Lee et al. ..................... 438/122 |
| 2001/0015492 | A1 | 8/2001 | Akram et al. |
| 2002/0005578 | A1 | 1/2002 | Kodama et al. |
| 2002/0006718 | A1 | 1/2002 | Distefano |
| 2002/0180035 | A1 | 12/2002 | Huang et al. |
| 2002/0185734 | A1 | 12/2002 | Zhao et al. |
| 2003/0034569 | A1 | 2/2003 | Caletka et al. |
| 2004/0032021 | A1 * | 2/2004 | Shieh et al. .................. 257/704 |
| 2004/0046241 | A1 * | 3/2004 | Combs et al. ................. 257/678 |
| 2004/0164404 | A1 * | 8/2004 | Huang .......................... 257/706 |
| 2005/0062149 | A1 * | 3/2005 | Karnezos et al. ............. 257/712 |
| 2005/0110140 | A1 * | 5/2005 | Kuo et al. ..................... 257/738 |

OTHER PUBLICATIONS

Printout of definition of the word "unitary" from the American Heritage Dictionary of the English Language, 1 page.*

U.S. Appl. No. 10/323,657, Chun Ho Fan et al., "Process for Manufacturing Ball Grid Array Package", filed Dec. 20, 2002.

U.S. Appl. No. 10/643,961, Chun Ho Fan et al., "Improved Ball Grid Array Package and Process for Manufacturing Same", filed Aug. 20, 2003.

U.S. Appl. No. 10/647,696, Mohan Kirloskar et al., "Improved Ball Grid Array Package and Process for Manufacturing Same", filed Aug. 25, 2003.

* cited by examiner

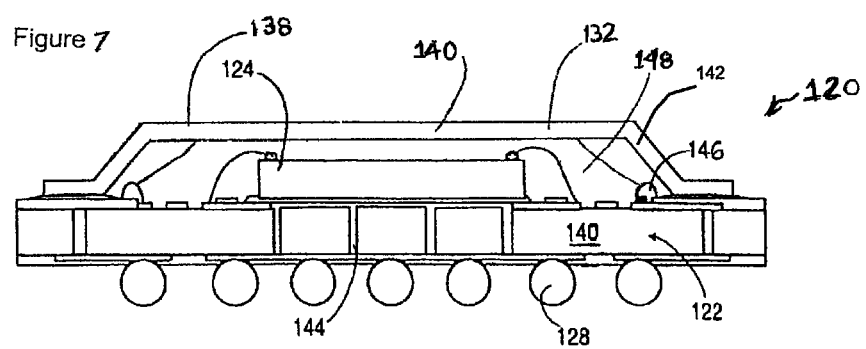

BALL GRID ARRAY PACKAGE WITH IMPROVED THERMAL CHARACTERISTICS

FIELD OF THE INVENTION

The present invention relates in general to integrated circuit packaging, and in particular to a ball grid array package with improved thermal dissipation and improved reliability.

BACKGROUND OF THE INVENTION

High performance integrated circuit (IC) packages are well known in the art. Improvements in IC packages are driven by industry demands for increased thermal and electrical performance and decreased size and cost of manufacture.

In general, array packaging such as Plastic Ball Grid Array (PBGA) packages provide a high density of interconnects relative to the surface area of the package. However, typical PBGA packages include a convoluted signal path, giving rise to high impedance and an inefficient thermal path which results in low thermal dissipation performance. With increasing package density, the spreading of heat generated by the device is increasingly important.

Reference is made to FIG. 1 which shows an elevation view of a conventional PBGA package indicated generally by the numeral 20. The PBGA package 20 includes a substrate 22 and a semiconductor die 24 attached to the substrate 22 by a die adhesive. Gold wire bonds electrically connect the die 24 to metal traces on the substrate 22. The wire bonds and die 24 are encapsulated in a molding compound 26. Solder balls 28 are disposed on the bottom surface of the substrate 22 for signal transfer. Because of the absence of a thermal path away from the semiconductor die, thermal dissipation in this package is very poor.

One method of improving heat dissipation is the addition of thermal vias in the substrate. The thermal vias connect the die 24 to some of the solder balls 28 for heat dissipation. While these thermal vias are advantageous for thermal dissipation, the thermal vias are small and increased thermal dissipation in high density packages is still desirable.

Variations to conventional BGA packages have been proposed for the purpose of increasing thermal and electrical performance. FIG. 2 shows an elevation view of a PBGA package of the prior art with a heat sink 30. The heat sink 30 is comprised of a metal plate added to the upper portion of the package 20 for dissipating heat from the upper surface of the package 20. This package still suffers disadvantages, however, as heat must be dissipated from the silicon die 24, through the molding compound 26 and then through the heat sink 30. Thus, heat dissipation away from the silicon die 24 in high density packages is still poor.

FIG. 3 shows an elevation view of yet another variation of the conventional BGA package according to the prior art. This package 20 includes a metal heat spreader 32 that is employed to dissipate heat from the semiconductor die 24 to the surrounding environment. The metal heat spreader 32 includes four legs 34, one leg at each corner. The legs 34 contact ground pads on the substrate 22, thereby providing four contact points with the ground pads. While this package provides better thermal dissipation than the package of FIG. 1, thermal dissipation is still poor and an improved thermal path from the semiconductor die is desirable.

Another example of a variation to conventional BGA packages is described in U.S. Pat. No. 5,977,626, issued Nov. 2, 1999, the contents of which are incorporated herein by reference. The '626 patent discloses a PBGA package having a metal heat spreader in contact with an upper surface of the semiconductor die and ground pads on the substrate. The heat spreader is added to dissipate heat from the semiconductor die to the surrounding environment. These packages also suffer disadvantages, however. One particular disadvantage is that the heat spreader and semiconductor die have significantly different thermo-mechanical properties causing induced stress on the semiconductor die during thermal cycling.

In applicant's own U.S. Pat. No. 6,737,755, issued May 18, 2004, the contents of which incorporated herein by reference, an improved PBGA package is disclosed in which a silicon die adapter is disposed between and fixed to both the semiconductor die and the metal heat spreader. This provides a thermal path from the semiconductor die to the heat spreader. While this package is an improvement over the prior art, further improvements in package reliability while still providing a thermal dissipation path, are still desirable. In particular, reduced interfacial delamination between elements of the package that are fixed together, is desirable.

SUMMARY OF THE INVENTION

In one aspect of the present invention, an integrated circuit package is provided. The integrated circuit package includes a substrate having first and second surfaces and a plurality of conductive traces therebetween and a semiconductor die mounted on the first surface of the substrate. A plurality of wire bonds connect the semiconductor die to ones of the conductive traces of the substrate and an encapsulant encapsulates the wirebonds and the semiconductor die. A heat spreader has a cap, at least a portion of the cap extending inwardly toward and being spaced from the semiconductor die. The encapsulant fills the space between the portion of the cap and the semiconductor die. The heat spreader further has at least one sidewall extending from the cap, the at least one sidewall disposed on the substrate. A ball grid array is disposed on the second surface of the substrate, bumps of the ball grid array being in electrical connection with ones of the conductive traces.

In another aspect of the present invention, a process for manufacturing an integrated circuit package is provided. The process includes: mounting a semiconductor die to a first surface of a substrate; wire bonding the semiconductor die to ones of conductive traces of the substrate; encapsulating the wire bonds and the semiconductor die in an encapsulant; mounting a heat spreader over the encapsulant such that at least a portion of a cap of the heat spreader extends inwardly toward and is spaced from the semiconductor die, the encapsulant filling the space between the portion of the cap and the semiconductor die, at least one sidewall of the heatspreader extending from the cap and disposed on the substrate; and forming a ball grid array on a second surface of the substrate, bumps of the ball grid array being electrically connected to the conductive traces.

In another aspect of the present invention, an integrated circuit package is provided. The integrated circuit package includes a substrate having first and second surfaces and a plurality of conductive traces therebetween and a semiconductor die mounted on the first surface of the substrate. A plurality of wire bonds connect the semiconductor die to ones of the conductive traces of the substrate and a glob-top encapsulant encapsulates the wirebonds and the semiconductor die. A heat spreader has a cap spaced from the semiconductor die. The encapsulant fills the space between the cap and the semiconductor die. The heat spreader further has at least one sidewall extending from the cap, the at least one sidewall disposed on the substrate. A ball grid array is disposed on the second surface of the substrate, bumps of the ball grid array being in electrical connection with ones of the conductive traces.

In still another aspect of the present invention, a process for manufacturing an integrated circuit package is provided. The process includes: mounting a semiconductor die to a first surface of a substrate; wire bonding the semiconductor die to ones of conductive traces of the substrate; encapsulating the wire bonds and the semiconductor die in a glob top encapsulant; mounting a heat spreader over the encapsulant such that the cap of the heat spreader is spaced from the semiconductor die, the encapsulant filling the space between the cap and the semiconductor die, at least one sidewall of the heatspreader extending from the cap and disposed on the substrate; and forming a ball grid array on a second surface of the substrate, bumps of the ball grid array being electrically connected to the conductive traces.

Advantageously, the BGA package of an aspect of the present invention has improved reliability and thermal performance. A heat dissipation path is provided by reducing the distance between the semiconductor die surface and the metal heat spreader, thereby resulting in a better thermal path. Although the metal heat spreader includes a portion that is very close to the semiconductor die, it is spaced from the die, thereby improving reliability in terms of interfacial delamination. In aspects of the invention, there are fewer fixed interfaces that are liable to interfacial delamination such as the interfaces between metal and silicon or the silicon die adapter and the semiconductor die. Further, overall package thickness can be reduced as compared to packages that include a silicon adaptor. Also, heat distribution is enhanced throughout the whole package by increasing the contact between the heat spreader and the substrate.

In another aspect, the liquid encapsulant provides a thermal path between the metal heat spreader and the substrate. In one particular aspect of the present invention, a glob-top encapsulation is used resulting in better wire sway control. Wire sway is the wire displacement during the encapsulation process. The glob-top material has a lower flow viscosity during encapsulation than the mold compound material, resulting in better wire sway control. Also, there is no phase change after the glob-top material is added.

BRIEF DESCRIPTION OF THE DRAWINGS

The present invention will be better understood with reference to the drawings and the following description in which:

FIGS. 5, 6 and 7 show a plastic ball grid array package with improved thermal characteristics, in accordance with alternative embodiments of the present invention.

DETAILED DESCRIPTION OF THE PREFERRED EMBODIMENTS

Figure 1:
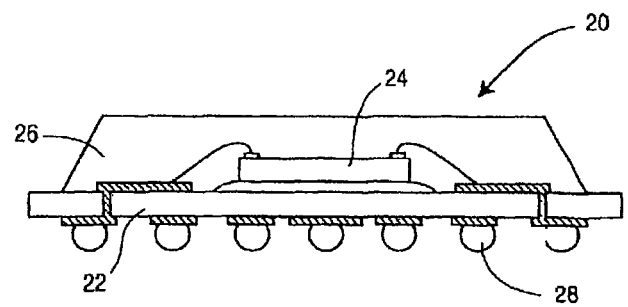
FIG. 1 shows an elevation view of a conventional plastic ball grid array package.
Figure 2:
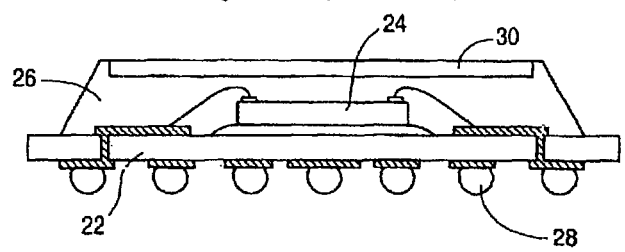
FIG. 2 shows an elevation view of a plastic ball grid array package with a heat sink, according to the prior art.
Figure 3:
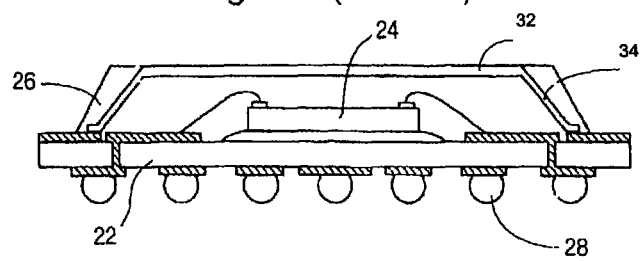
FIG. 3 shows an elevation view of a plastic ball grid array package with a heat spreader according to the prior art.

To simplify the description, the numerals used previously in describing FIGS. 1 to 3 will be used again after raising the numerals by 100 where the parts to be described correspond to parts already described.

Reference is now made to FIGS. 4A to 4K to describe the processing steps for manufacturing a ball grid array package with improved thermal characteristics, in accordance with one embodiment of the present invention. The ball grid array package 120 includes a substrate 122 having first and second surfaces and a plurality of conductive traces therebetween. A semiconductor die 124 is mounted on the first surface of the substrate 122. A plurality of wire bonds connect the semiconductor die 124 to ones of the conductive traces of the substrate 122 and an encapsulant 148 encapsulates the wirebonds and the semiconductor die 124. A heat spreader 132 has a cap 138, at least a portion 140 of the cap extending inwardly toward and being spaced from the semiconductor die 124. The encapsulant 136 fills the space between the portion 140 of the cap 138 and the semiconductor die 124. The heat spreader 132 further has at least one sidewall 142 extending from the cap 138, the at least one sidewall 142 disposed on the substrate 122. Solder balls 128 in the form of a ball grid array, are disposed on the second surface of the substrate 122. The solder balls 128, also referred to as bumps of the ball grid array, are in electrical connection with ones of the conductive traces.

Figure 4A:
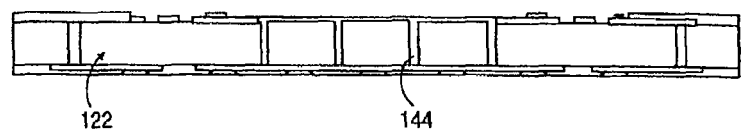
FIGS. 4A to 4K show the processing steps for manufacturing a ball grid array package with improved thermal characteristics, in accordance with an embodiment of the present invention.

The process for fabricating the plastic ball grid array package 120 will now be described with particular reference to FIGS. 4A to 4K. Referring first to FIG. 4A, there is provided a substrate 122 of a BT resin/glass epoxy printed circuit board with conductive traces for signal transfer. Thermal vias 144 through the substrate 122 are provided under the position where the semiconductor die 124 is attached. A solder mask is disposed on the upper and lower surfaces of the substrate 122, with upper portions and lower portions of the conductive traces (interconnects) exposed as shown.

Figure 4B:
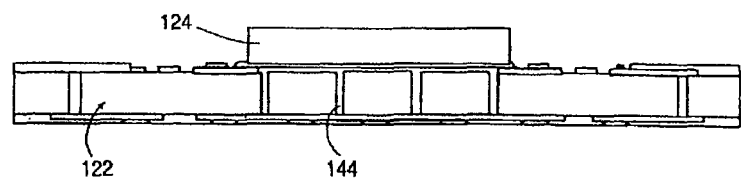
Figure 4C:
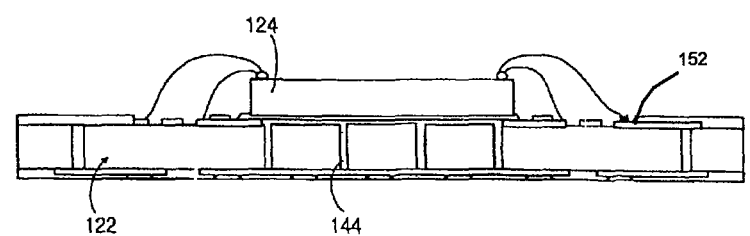
Figure 4D:
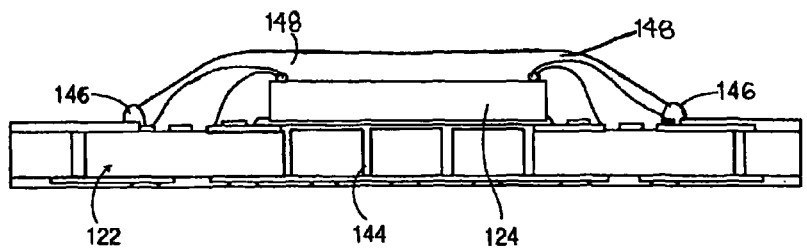

A singulated semiconductor die 124 is conventionally mounted to an upper surface of the substrate 122 using a die attach epoxy (FIG. 4B). The semiconductor die 124 includes a conductive pad array formed thereon and gold wires are bonded between the conductive pads of the array and the conductive traces 152 of the substrate 122 using conventional wire bonding techniques (FIG. 4C).

Next, an epoxy is dispensed on the top surface of the substrate 122, around the semiconductor die 124, forming a liquid dam 146. The semiconductor die 124 and wire bonds are encapsulated using a glob-top encapsulant 148 (liquid epoxy) (FIG. 4D), as would be understood by those skilled in the art. The glob-top encapsulant 148 protects the wire bonds as well as the semiconductor die 124.

Figure 4E:
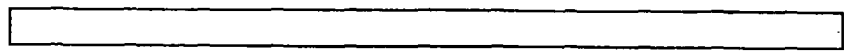
Figure 4F:
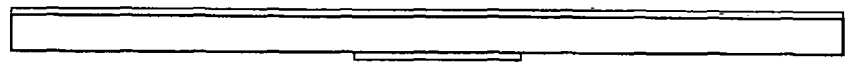

Following encapsulation, a heat spreader 132 is formed. In the present embodiment, the heat spreader 132 is formed by selectively etching a copper metal plate, followed by metal forming or bending. Reference is made to FIG. 4E, which shows a metal plate which forms the raw material of the heat spreader 132. The metal plate is then selectively etched by coating with a mask layer of photo-imageable etch resist such as a photo-imageable epoxy. The layer of photo-imageable etch resist is imaged with a photo-tool by exposure of the photo-imageable solder mask to ultraviolet light masked by the photo-tool followed by developing. The photo-imageable etch resist is thereby patterned to cover the central portion of a first side of the metal plate. The outer edges of the first side of the metal plate are exposed, as shown in FIG. 4F. The opposing second side of the metal plate is covered by the photo-imageable etch resist.

Figure 4G:
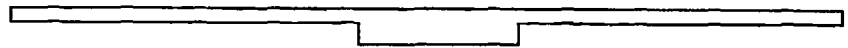

The metal plate is then alkaline etched via full immersion etching to remove exposed portions thereof, followed by removal of the etch resist. The area of the metal plate that is covered by the etch-resist is protected from etching. Thus, the plate is selectively etched to reduce the thickness of the outer edges of the metal plate, which are later formed into sidewalls of the heat spreader. The metal plate after etching is shown in FIG. 4G.

Figure 4H:
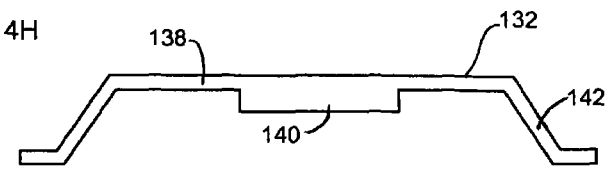

After etching, the metal plate is formed by bending to provide the heat spreader 132 shown in FIG. 4H. As shown, the heat spreader 132 includes a cap 138 with four sidewalls 142 that extend away from the cap 138. In the orientation shown in FIG. 4H, each sidewall 142 extends downwardly and outwardly from a respective edge of the generally square cap 138. The cap 138 includes a central portion 140 with a thickness that is greater than the remainder of the heat spreader 132. Clearly this portion 140 is the portion of the heat spreader that was protected during etching.

Figure 4I:
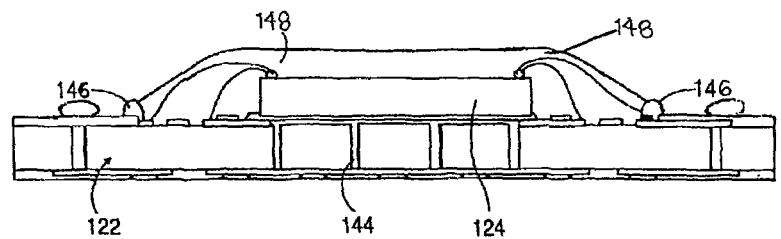

The heat spreader 132 is then fixed to the upper surface of the substrate 122 by fixing the ends of each sidewall 142 to the substrate 122 using, for example, conductive epoxy. As shown, the conductive epoxy is dispensed on the upper surface of the substrate 122, at suitable locations for fixing each sidewall 142 of the heat spreader 132 to the substrate 122 (FIG. 4I).

Figure 4J:
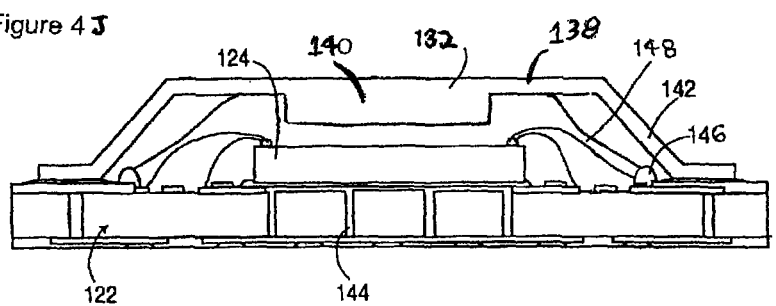

Next, the heat spreader 132 is located on the substrate 122 with each sidewall 142 disposed on the fixed to metal traces on the upper surface of the substrate 122 (FIG. 4J0. Using a conductive epoxy or other suitable conductive material to fix each sidewall 142 to the metal traces or to metal pads of the substrate 122, permits the grounding of the heat spreader 132 by fixing at least one sidewall 142 to a ground pad on the substrate 122. As shown, the central portion 140 of the cap 138 extends inwardly toward the semiconductor die 124 such that the central portion 140 is very close to but does not contact the semiconductor die 124. The central portion 140 is also sized and shaped such that it does not interfere with the wire bonds extending from the semiconductor die 124. The glob-top encapsulate 148 fills the space between the semiconductor die 124 and the central portion 140 of the cap 138. The heat spreader 132 thereby provides a thermal path away from the semiconductor die 124 and to the top of the package 120. After fixing the heat spreader 132 to the substrate 122, the epoxy and the encapsulant 148 are cured.

Figure 4K:
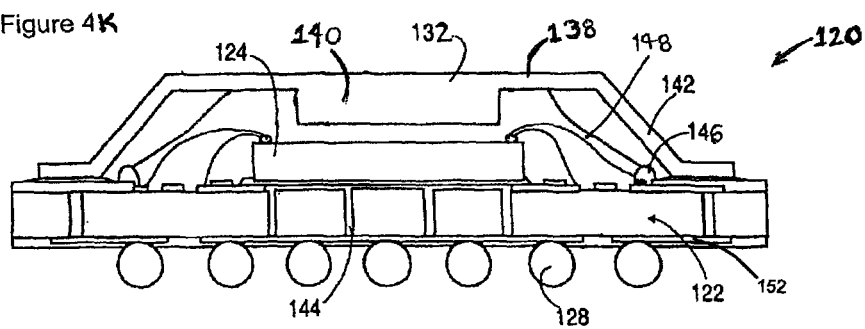

A ball grid array (BGA) of solder balls 128, also referred to as solder bumps, is formed on the bottom surface of the substrate 122 at the exposed portions 146 of the conductive traces (FIG. 4K). To attach the solder balls 128, a flux is added to the balls prior to placement and, after placement, the solder balls are reflowed using known reflow techniques. The solder balls 128 are thereby connected to the conductive traces 152 of the substrate 122 and through the gold wires, to the semiconductor die 124. The solder balls 128 provide signal and power connections as well as ground connections for the semiconductor die 124.

Figure 5:
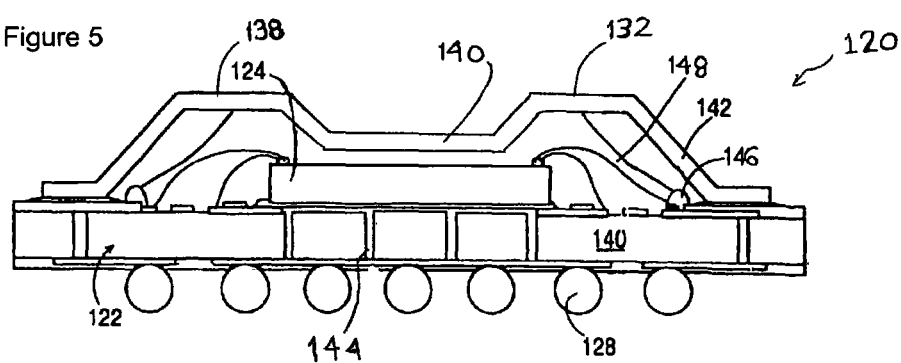

Referring now to FIG. 5, there is shown a plastic ball grid array package 120 in accordance with an alternative embodiment of the present invention. The plastic ball grid array package 120 shown in FIG. 5 is similar to the package shown and described in FIG. 4A to 4K. In the present embodiment, however, the heat spreader 132 is fabricated by simply bending a metal plate to create the four sidewalls 142 and the formed cap 138. Thus, the central portion 140 of the cap 138 is formed by bending the metal plate in the configuration shown in FIG. 5. Clearly the central portion 140 of the cap 138 extends inwardly of the package 120 as in the first described embodiment. In the present embodiment, however, the thickness of the heat spreader 132 is generally uniform. The remainder of the steps for fabricating the plastic ball grid array 120 are similar to those described above and therefore are not further described herein.

Figure 6:
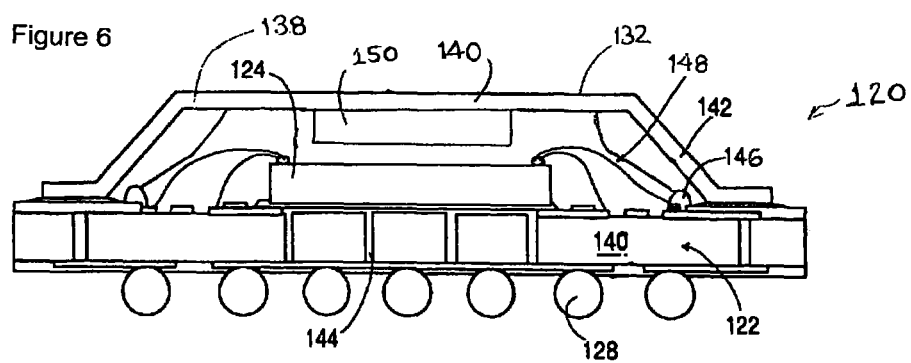

Reference is now made to FIG. 6 which shows a plastic ball grid array package 120 with improved thermal characteristics, in accordance with another alternative embodiment of the present invention. The plastic ball grid array package 120 shown in FIG. 6 is similar to the package shown and described in FIGS. 4A to 4K. In the present embodiment, however, the heat spreader 132 is fabricated by bending a metal plate to create the four sidewalls 142 extending outwardly from the cap 138, followed by fixing a metal heat slug at the center of the formed metal plate using a thermally conductive epoxy. The metal heat slug and the central portion of the heat spreader 132 together form the central portion 140 of the cap 138, as in the first described embodiment. The remainder of the steps for fabricating the plastic ball grid array 120 are similar to those described above and therefore are not further described herein.

Reference is now made to FIG. 7 which shows a plastic ball grid array package 120 with improved thermal characteristics, in accordance with still another alternative embodiment of the present invention. The plastic ball grid array package 120 shown in FIG. 7 is similar to the package shown and described in FIGS. 4A to 4K. In the present embodiment, however, the heat spreader 132 is fabricated by bending a metal plate to create the four sidewalls 142 extending outwardly from the cap 138. Also, the central portion 140 of the cap 138 of the heat spreader 132 does not extend inwardly toward the semiconductor die 124. In the present embodiment, the wire loop height after wire bonding is low, allowing for a low heat spreader profile, as shown. Thus, the central portion 140 of the cap 138 of the heat spreader 132 is still close to but does not touch the semiconductor die 124. In the present embodiment, the clearance or spacing between the heat spreader 132 and the closest surface of the semiconductor die 124 is in the range of about 4 to about 16 mils. The glob-top encapsulant protects the wire bonds while providing reduced wire sway. One example of suitable glob-top material is silicon. Advantageously, the present embodiment is not limited to a minimum die size, therefore increasing package design flexibility. Further, the heat spreader 132 is located close to both the semiconductor die 124 and the wire bonds to provide heat dissipation.

Specific embodiments of the present invention have been shown and described herein. However, modifications and variations to these embodiments are possible. For example, other substrate materials and conductive metal or alloy traces are possible and will occur to those skilled in the art. The heat spreader material is not limited to copper as other suitable materials can be used, including. Also, other shapes of heat spreaders are possible. Rather than using epoxy to fix the heat spreader to the substrate, solder or adhesive film can be used. Further, the encapsulant is not limited to silicon glob-top material as any suitable liquid encapsulant can be used, including but not limited to an epoxy based material. Those skilled in the art may conceive of still other modifications and variations, all of which are within the scope and sphere of the present invention.

What is claimed is:

1. A process for manufacturing an integrated circuit comprising:
   mounting a semiconductor die to a first surface of a substrate;
   wire bonding said semiconductor die to ones of conductive traces of said substrate;
   fixing at least one ground pad to said substrate;
   encapsulating the wire bonds and said semiconductor die in a glob-top encapsulant material;

disposing over said glob-top encapsulant material a heat spreader having a cap protruding therefrom, the heat spreader having at least one sidewall extending from the cap;

embedding the cap into the glob-top encapsulant material while the glob-top encapsulant is in an uncured state such that the cap extends inwardly from the heat spreader and is spaced apart from the semiconductor die, the cap and the semiconductor die defining a space disposed therebetween, the space being completely filled by the glob-top encapsulant material;

fixing said at least one sidewall to said at least one ground pad, an outer surface of the heat spreader is exposed to the surrounding environment and an inner surface of the at least one sidewall being spaced apart from the encapsulant material; and forming a ball grid array on a second surface of said substrate, bumps of said ball grid array being electrically connected to said conductive traces.

2. The process according to claim 1, wherein said encapsulating the wire bonds and said semiconductor die comprises depositing a liquid dam on a top surface of said substrate and encapsulating said wire bonds and said semiconductor die in the glob-top encapsulant material.

3. The process according to claim 1, wherein said mounting a heat spreader comprises fixing at least one sidewall to the substrate.

4. The process according to claim 1, wherein said mounting a heat spreader comprises fixing four sidewalls that extend from said cap to said substrate.

5. The process according to claim 1, further comprising forming said heat spreader to provide said portion that extends inwardly, prior to mounting said heat spreader.

6. The process according to claim 1, further comprising etching said heat spreader such that said portion of said cap has a thickness that is greater than a remainder of said heat spreader, prior to mounting said heat spreader.

7. The process according to claim 1, further comprising, fixing a heat slug to said cap of said heat spreader.

8. The process according to claim 1, wherein said mounting said heat spreader comprises fixing said at least one sidewall to at least one of said conductive traces of said substrate.

9. A process for manufacturing an integrated circuit comprising:

mounting a semiconductor die to a first surface of a substrate;

wire bonding said semiconductor die to ones of conductive traces of said substrate;

mounting a ground pad on said substrate;

encapsulating the wire bonds and said semiconductor die in a glob-top encapsulant;

disposing over said glob-top encapsulant material a single piece heat spreader having a cap protruding therefrom, the single piece heat spreader having at least one sidewall extending from the cap;

embedding the cap into the glob-top encapsulant material while the glob-top encapsulant material is in an uncured state such that the cap extends inwardly from the single piece heat spreader and is spaced apart from the semiconductor die by a distance in the range of about 4 to about 16 mils, the cap and the semiconductor die defining a space disposed therebetween, the space being completely filled by the glob-top encapsulant material and an outer surface of the single piece heat spreader being exposed to the surrounding environment; and forming a ball grid array on a second surface of said substrate, bumps of said ball grid array being electrically connected to said conductive traces.

10. The process according to claim 9, wherein said mounting a heat spreader comprises fixing four sidewalls that extend from said cap, to said substrate.

11. The process according to claim 9, wherein said mounting said heat spreader comprises fixing said at least one sidewall to at least one of said conductive traces of said substrate.

* * * * *